United States Patent [19]

Uchiyama

[11] Patent Number: 5,666,206
[45] Date of Patent: Sep. 9, 1997

[54] EXPOSURE SYSTEM AND EXPOSURE METHOD

[75] Inventor: Takayuki Uchiyama, Tokyo, Japan

[73] Assignee: NEC Corporation, Tokyo, Japan

[21] Appl. No.: 604,386

[22] Filed: Feb. 21, 1996

[30]   Foreign Application Priority Data

Feb. 21, 1995  [JP]  Japan ................................ 7-032164

[51]  Int. Cl.$^6$ ............................................... G01B 11/00
[52]  U.S. Cl. .................................. 356/401; 355/68
[58]  Field of Search ............................ 356/122, 399–401,
356/121, 214–218; 250/205; 355/53, 77,
43, 71, 55, 68, 69

[56]   References Cited

U.S. PATENT DOCUMENTS

| | | | |
|---|---|---|---|
| 4,988,188 | 1/1991 | Ohta | 355/53 X |
| 5,420,417 | 5/1995 | Shiraishi | 356/121 |

OTHER PUBLICATIONS

K. Yamanaka et al.; "NA and σ Optimization for High NA I–line Lithography"; SPIE vol. 1927, Optical Laser Microlithography VI (1993); pp. 310–319.

Primary Examiner—K. Hantis
Attorney, Agent, or Firm—Whitham, Curtis, Whitham & McGinn

[57]   ABSTRACT

An exposure system and method that enable to realize uniform pattern transfer with high accuracy independent of time-dependent illumination deterioration of an exposing light source and/or replacement thereof. An illumination detector detects an illumination of a ray of the exposing light penetrating through one of lens elements of a fly-eye lens. An aligner aligns a position of the detector with a corresponding one of the lens elements of a fly-eye lens. The repetition of the illumination detection for all the lens elements enables to know and compare the illumination distribution for the entire beam of the light with a wanted one in advance. An exposure process is performed after suitable correction of the known distribution and therefore, pattern transfer can be realized uniformly with high accuracy even for fine patterns on a reticle.

14 Claims, 9 Drawing Sheets

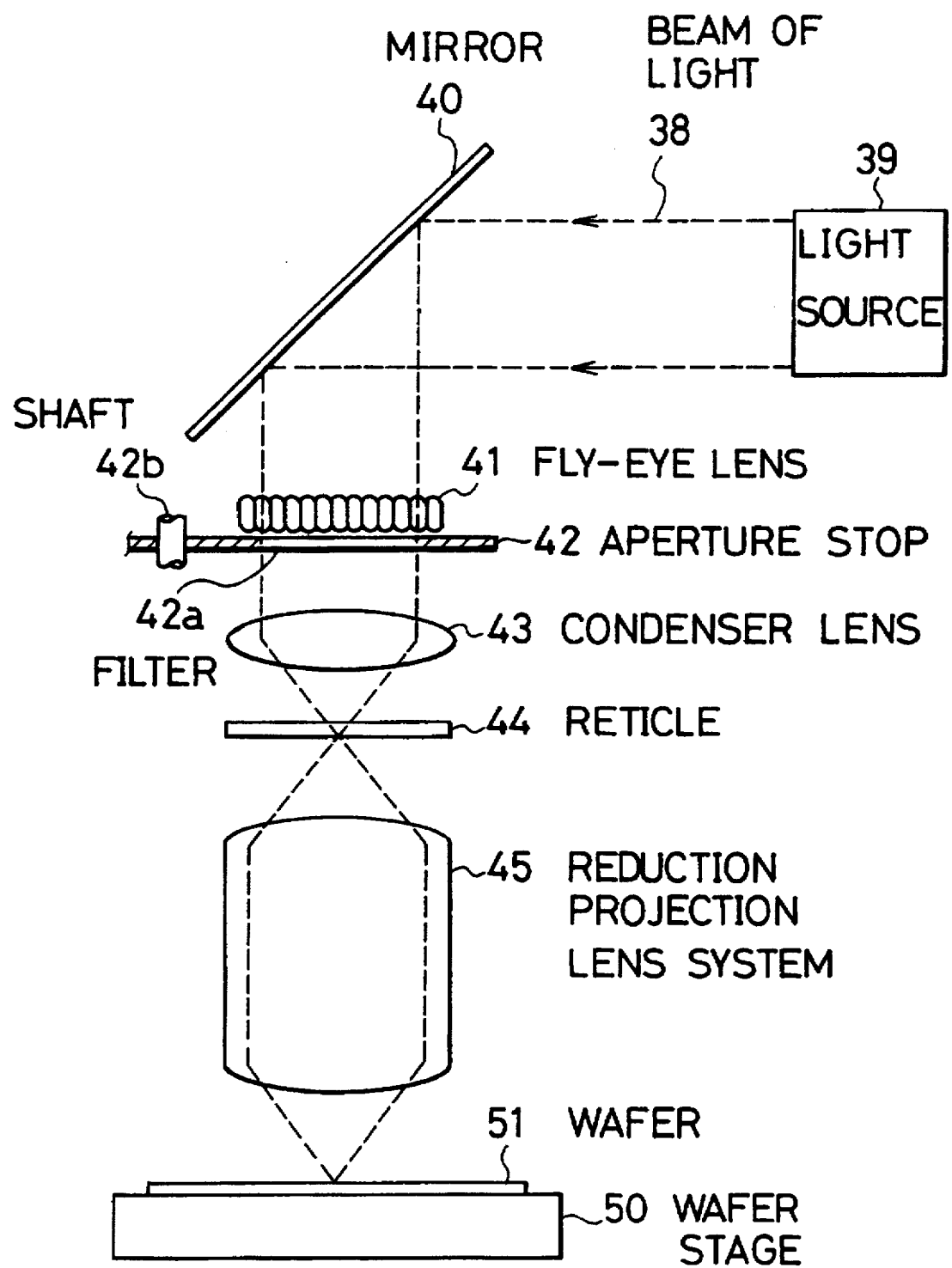

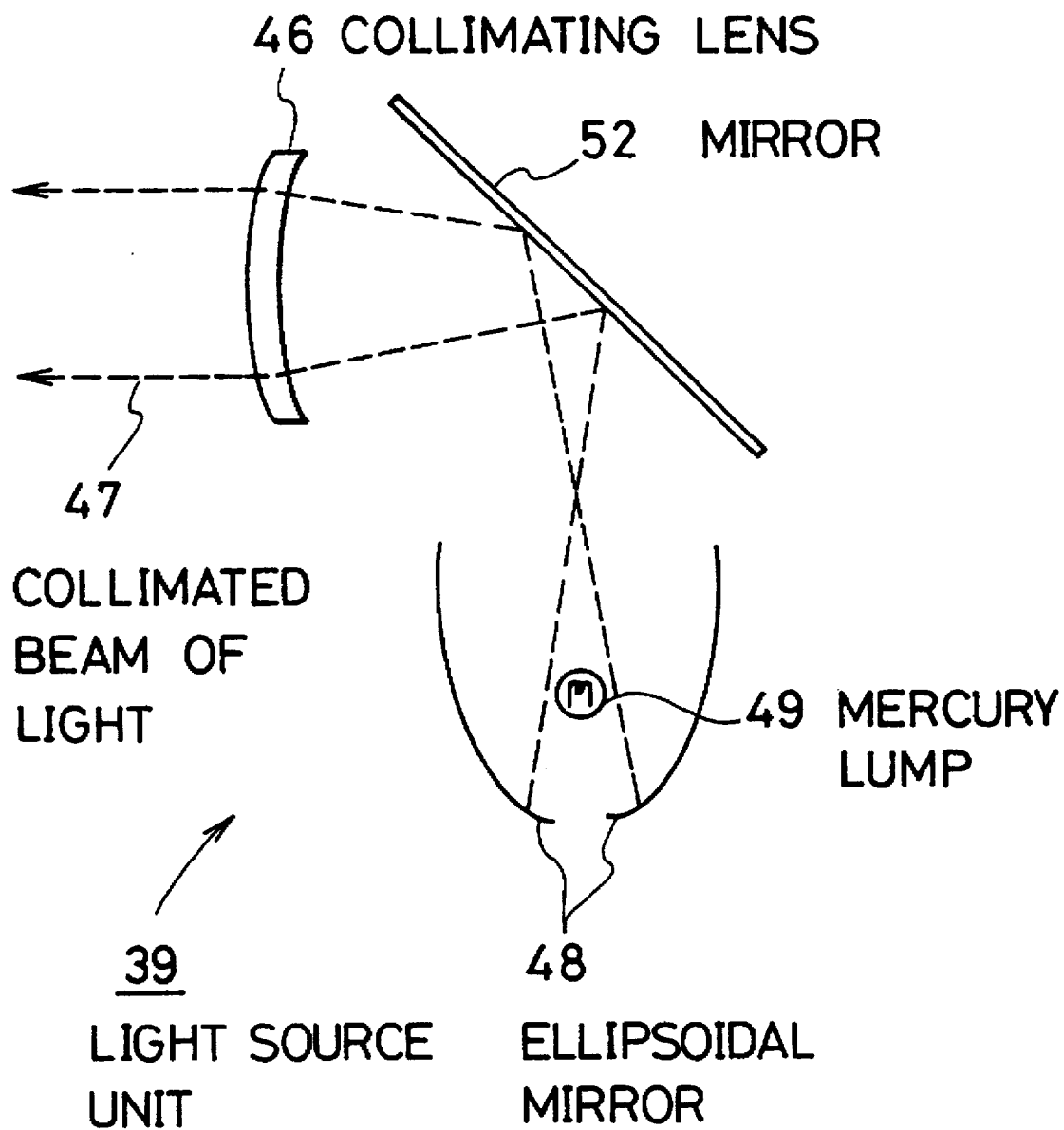

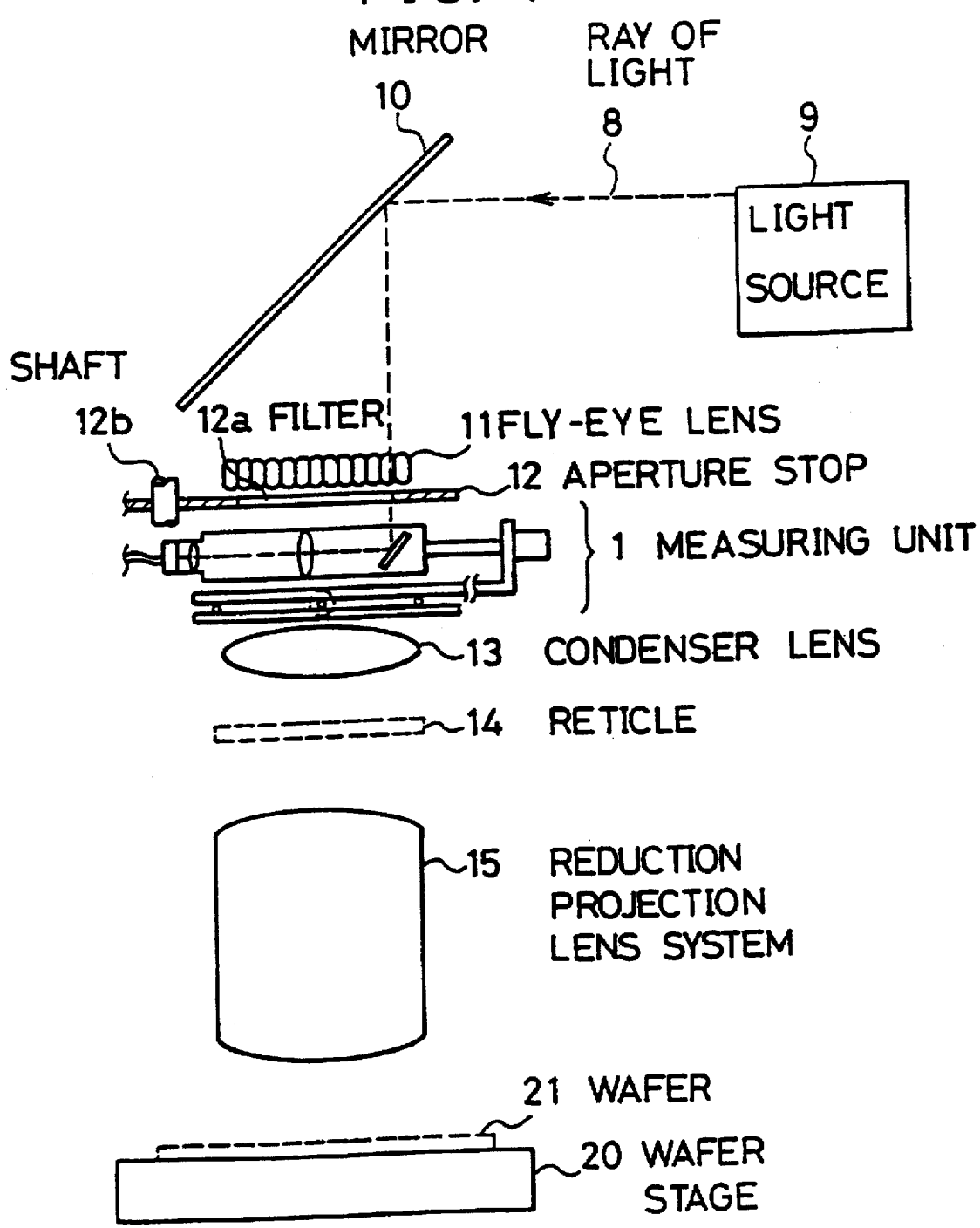

EXPOSURE SYSTEM AND EXPOSURE METHOD

BACKGROUND OF THE INVENTION

1. Field of the Invention

The present invention relates to an exposure system and an exposure method and more particularly, to an exposure system and an exposure method that are effective for an exposure process using deep ultraviolet (Deep-UV) light and that are applicable to fabrication of semiconductor devices or the like.

2. Description of the Prior Art

To form integrated circuits on a semiconductor wafer, generally, an exposure system is used to transfer patterns of geometrical shapes formed on an exposure mask to the wafer. An example of the conventional exposure systems is shown in FIG. 1, which is a reduction step-and-repeat projection exposure system.

The conventional projection exposure system shown in FIG. 1 is equipped with a light source unit 39, a reflection mirror 40, a fly-eye lens 41, an aperture stop 42, a condenser lens 43, a reduction projection lens system 45, and a wafer stage 50.

The light source unit 39 generates exposing light and emits a beam 38 of the exposing light to the reflection mirror 40. The mirror 40 reflects the beam 38 and changes its direction toward the fly-eye lens 41. The fly-eye lens 41 receives the beam 38 of the light to minimize its illumination variation or fluctuation, making its intensity uniform over the entire beam 38 at the outlet of the lens 41.

The aperture stop 42 has a filter 42a for narrowing the beam 38 of the exposing light penetrating through the fly-eye lens 41 and for adjusting the intensity distribution within the cross-section of the beam 38. The stop 42 with the filter 42a can be turned around a vertically fixed shaft 42b so that it is on or out of the optical path of the beam 38 for replacement.

The condenser lens 43 receives the narrowed and intensity-adjusted beam 38 by the aperture stop 42 to focus it on a reticle 44 placed between the lens 43 and the projection lens system 45. The reduction projection lens system 45 projects an image of the patterns of geometrical shapes formed on the reticle 44 to a semiconductor wafer 51 placed on the wafer stage 50 with a specified demagnification ratio. These patterns define the various regions in an integrated circuit (IC) such as the implantation regions and the contact windows.

The patterns of the geometrical shapes on the reticle 44 are 2 to 10 times as large as original patterns to be transferred. In other words, the demagnification or reduction ratio of the exposure system is set as 2 to 10.

The wafer 51, which is placed on the wafer stage 50, has a plurality of image fields arranged in a matrix array. Each of the image fields is exposed to the beam 38 of the exposing light at a time. The shape and size of each image field are, for example, square and approximately 20 mm×20 mm, respectively.

The image fields of the wafer 51 are stepped over its surface by two-dimensional translations of the wafer 51, which is generated by movement of the wafer stage 50. Thus, all the image fields are successively exposed to the beam 38 of the exposing light, thereby transferring the patterns of the reticle 44 onto all the image fields.

FIG. 2 shows the structure of an example of the light source unit 39 shown in FIG. 1. When the g-line with a wavelength of 436 nm or the i-line with a wavelength of 365 nm is used as the exposing light, a mercury (Hg) lamp 49 is used as a source of the exposing light. A beam 47 of the g- or i-line is condensed by ellipsoidal mirrors 48 disposed near the lamp 49. The condensed beam 47 is reflected by a reflection mirror 52 and is entered a collimating lens 46. The lens 46 collimates the incident beam 47, thereby making the beam 47 parallel. The parallel beam 47 is propagated to the mirror 40 through an illumination lens system (not shown) and is used as the beam 38 of the exposing light shown in FIG. 1.

When KrF excimer light with a wavelength 248 nm or ArF excimer light with a wavelength 193 nm is used as the exposing light, a KrF or ArF excimer laser system is generally used instead of the mercury lamp 49.

The above four sorts of the exposing light are within the Deep-UV region of the electromagnetic spectrum.

The light intensity distribution of the beam 38 of the exposing light governs the resolution of the patterns of the geometrical shapes of the reticle 44. Therefore, the aperture stop 42 and/or the filter 52a thereof are necessary to be replaced according to the sorts of the patterns on the reticle 44.

On replacement of the stop 42 and/or filter 42a, the stop 42 with the filter 42a is turned around the vertical shaft 42b to be out of the optical path of the beam 38. Then, after finishing the replacement, the stop 42 and the filter 42a are rotated back around the shaft 42b to its original position again, which is on the optical path of the beam 38 under the fly-eye lens 41.

FIGS. 3A and 3B show the light intensity distribution of the beam 38 at the outlet of the fly-eye lens 41. Typically, the intensity distribution of FIG. 3A is used, which is relatively high for the central area and relatively low for the edge or periphery. This distribution is called as the "Gaussian distribution".

However, for fine or minute patterns of geometrical shapes, it is known that a uniform intensity distribution (as shown in FIG. 3B) of the beam 38 of the light improves the depth of focus (DOF) of the beam 38, because the component of the beam 38 entering obliquely the reticle 44, which corresponds to the component penetrating through the edge or periphery of the fly-eye lens 41, plays an important role. This fact was, for example, disclosed by K. Yamanaka et al, in "NA and σ Optimization for High NA I-line Lithography", SPIE Vol. 1927, Optical/Laser Microlithography VI, 1993, pp. 310 to 319. This article reported the following matter:

The i-lien was used as exposing light, the numerical aperture (NA) of a reduction projection lens system was 0.6, and a coherence factor σ of illumination and projection lens systems was 0.7. A lines and spaces (L/S) pattern of 0.35 µm was formed on a reticle. The DOF for a uniform distribution (as shown in FIG. 3B) at the outlet of an aperture stop was more advantageous than that for the above Gaussian distribution (as shown in FIG. 3A).

The illumination of the mercury lamp 49 in the light source unit 39 tends to deteriorate with time and therefore, the lamp 49 is necessary to be replaced periodically. With the above conventional projection exposure system of FIG. 1, due to the time-dependent deterioration in illumination of the lamp 49 and/or replacement thereof, the light intensity distribution of the beam 38 of the exposing light changes, thereby causing some change in optical conditions of the exposure system.

As a result, inferior or unsatisfactory pattern transfer often occurs because of degradation in DOF and/or resolution.

Also, the pattern transfer formation process cannot be optimized according to a particular type of patterns on the reticle 44.

To solve such the problem, a photographic film may be inserted within the optical path of the beam 38 to print its light spot thereon. Although this technique enables to know the intensity distribution of the beam 38, it increases the downtime for this pattern transfer process. Thus, this technique is difficult to be actually used.

SUMMARY OF THE INVENTION

An object of the present invention is to provide an exposure system and an exposure method that enables to realize uniform pattern transfer with high accuracy independent of time-dependent illumination deterioration of an exposing light source and/or replacement thereof.

Another object of the present invention is to provide an exposure system and an exposure method that enables to realize uniform pattern transfer with high accuracy even for fine patterns of geometrical shapes on a reticle.

A further object of the present invention is to provide an exposure system and an exposure method that allows exposure to be made at a fixed light intensity distribution.

The above objects together with others not specifically mentioned will become clear to those skilled in the art from the following description.

According to a first aspect of the present invention, an exposure system is provided, which is equipped with (a) a light source for emitting a beam of exposing light, (b) a fly-eye lens for minimizing the illumination variety of the beam within its cross section, (c) an aperture stop for narrowing the beam for penetrating through the fly-eye lens and for adjusting the intensity distribution thereof, and (d) a wafer stage for supporting a wafer thereon. The fly-eye lens have lens elements arranged in a plane.

The exposure system further contains (e) an illumination detector for detecting an illumination of a ray of the exposing light penetrating through one of the lens elements of the fly-eye lens, and (f) an aligner for aligning a position of the detector with the corresponding one of the lens elements.

With the exposure system according to the first aspect of the invention, the illumination detector detects the illumination of the ray of the exposing light penetrating through one of the lens elements of the fly-eye lens, and the aligner aligns the position of the detector with the corresponding one of the lens elements to receive the ray penetrating therethrough. Therefore, by aligning sequentially the position of the detector with the respective lens elements of the fly-eye lens, the intensity distribution of the beam of the light can be known for the entire fly-eye lens.

As a result, even if the time-dependent illumination deterioration of the light source of the exposing light and/or replacement of the source occur, satisfactory DOF and resolution can be maintained. Accordingly, uniform pattern transfer with the high accuracy can be realized independent of the time-dependent illumination deterioration of the light source and/or replacement of the source.

This uniform pattern transfer with high accuracy can be realized even for fine patterns of geometrical shapes on a reticle, because the intensity distribution of the beam of the light can be known for the entire fly-eye lens.

Further, since the shape and the intensity distribution of the beam can be adjusted with the aperture stop based on the known intensity distribution of the beam, an exposure process can be made at a fixed light intensity distribution.

In a preferred embodiment of the exposure system, the illumination detector is placed between the aperture stop and the wafer stage. In this case, the detector detects the illumination of the ray penetrating through one of the lens elements of the fly-eye lens and the aperture stop.

In another preferred embodiment of the exposure system, the illumination detector is placed on the wafer stage. In this case, the detector detects on the stage the illumination of the ray penetrating through one of the lens elements of the fly-eye lens and the aperture stop. There arises an additional advantage that the intensity distribution of the beam of the exposing light on the wafer can be exactly known.

The aperture stop preferably has a filter for shaping the beam of the exposing light and adjusting the intensity distribution thereof. This can be readily accomplished by preparing a variety of the filters and replacing one of the filters with another.

According to a second aspect of the present invention, an exposure method is provided. In this method, (a) the illumination of the rays of the exposing light penetrating through the lens elements of the fly-eye lens is detected, thereby measuring the intensity distribution of the beam of the light for the entire fly-eye lens. (b) The measured value of the intensity distribution obtained through the measurement is compared with a wanted value of the intensity distribution. (c) The measured value of the intensity distribution is corrected by adjusting the value of the intensity distribution of the aperture stop according to the result of the comparison. (d) An exposure process is performed using the corrected value of the intensity distribution.

With the exposure method according to the second aspect of the invention, the intensity distribution of the beam of the light is measured for the entire fly-eye lens by detecting the illumination of the rays of the exposing light penetrating through the lens elements of the fly-eye lens. The measured value obtained through the measurement is then compared with a wanted value of the intensity distribution, and the measured value is corrected by adjusting the value of the intensity distribution of the aperture stop according to the result of the comparison. An exposure process is then performed using the corrected value of the intensity distribution.

Accordingly, even if the time-dependent illumination deterioration of the light source of the exposing light and/or replacement of the source occur, satisfactory DOF and resolution can be maintained. As a result, uniform pattern transfer with high accuracy can be realized independent of the time-dependent illumination deterioration of the light source and/or replacement of the source.

This uniform pattern transfer with high accuracy can be realized even for fine patterns of geometrical shapes on a reticle because of the measured value of the intensity distribution of the beam for the entire fly-eye lens.

Further, since the shape and the intensity distribution of the beam can be corrected based on the comparison prior to the exposure process, an exposure process can be made at a fixed light intensity distribution.

In a preferred embodiment of the method, the correction of the intensity distribution is performed by preparing a variety of filters offering different intensity distributions for the aperture stop and by replacing one of the filters with another.

BRIEF DESCRIPTION OF THE DRAWINGS

In order that the invention may be readily carried into effect, it will now be described with reference to the accompanying drawings.

FIG. 1 is a schematic view of an example of the conventional reduction step-and-repeat projection exposure systems.

FIG. 2 is a schematic view of an example of the conventional light source units used for the exposure system of FIG. 1.

FIG. 4 is a schematic view of a reduction step-and-repeat projection exposure system according to a first embodiment of the present invention.

DETAILED DESCRIPTION OF THE PREFERRED EMBODIMENTS

Figure 3A:
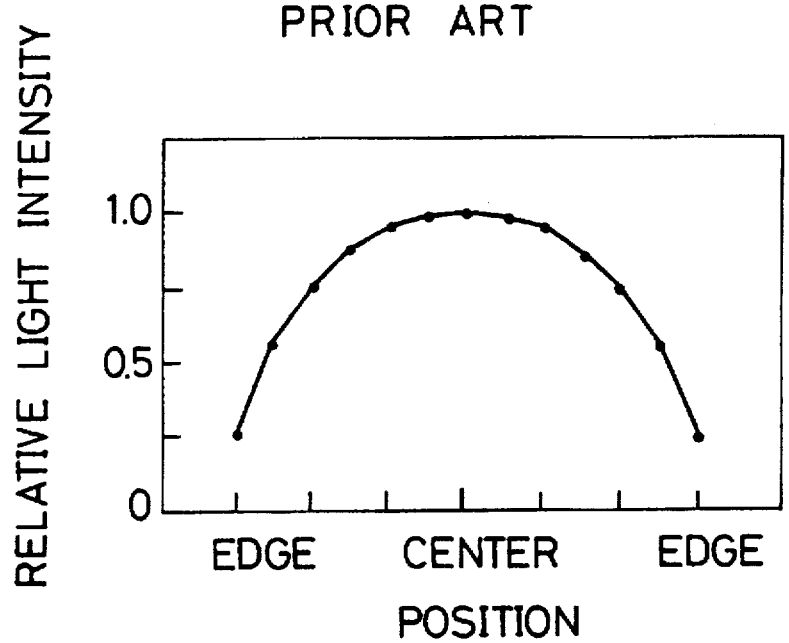
FIG. 3A is a graph showing the light intensity distribution of a beam of an exposing light for an entire fly-eye lens at its outlet, which is called as the "Gaussian distribution".

Preferred embodiments of the present invention will be described in detail below while referring to the drawings attached.

First Embodiment

Figure 5:
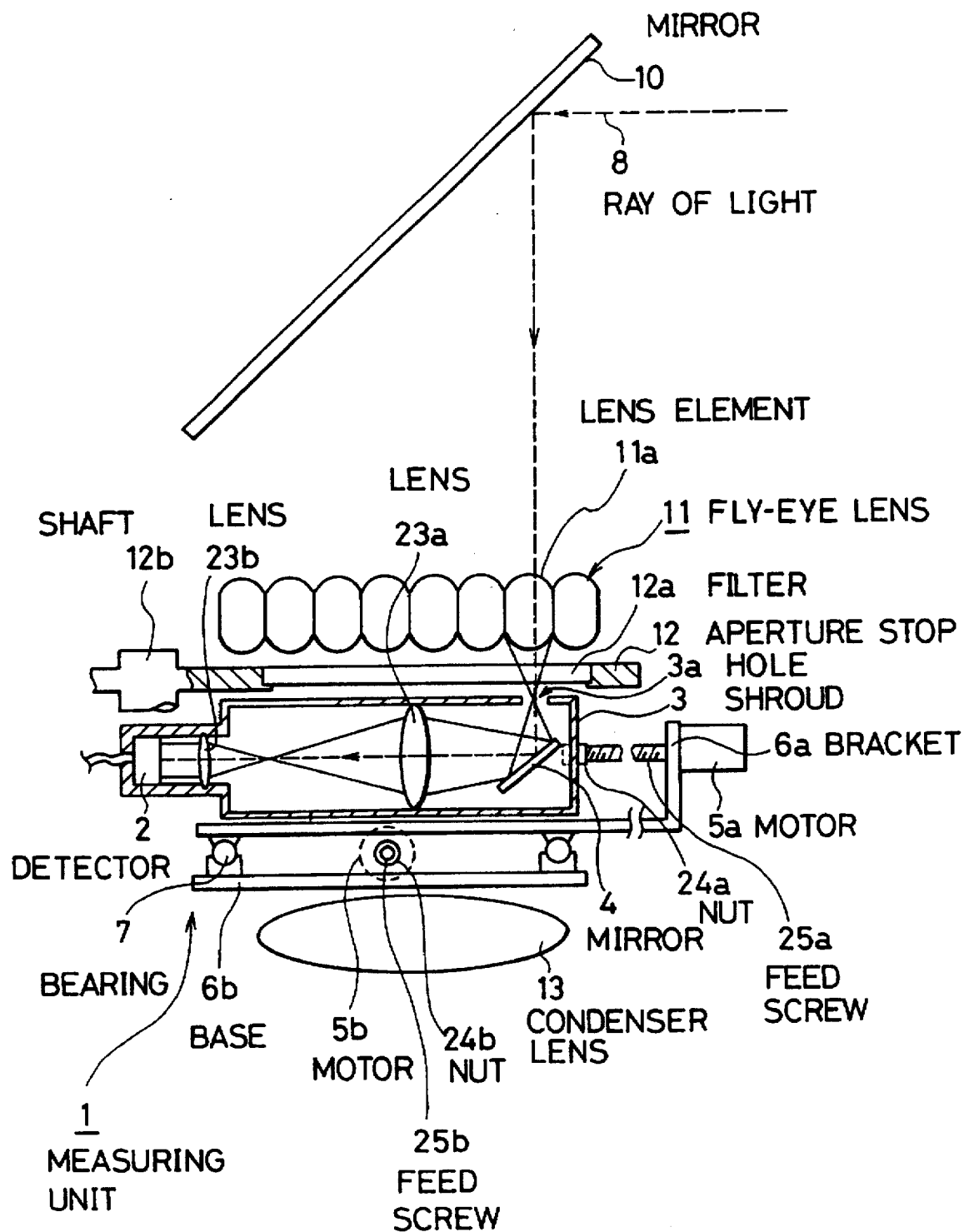
FIG. 5 is an enlarged, partial schematic view of the reduction step-and-repeat projection exposure system according to the first embodiment.

As shown in FIGS. 4 and 5, a reduction step-and-repeat projection exposure system according to a first embodiment of the present invention is equipped with a light source unit 9, a reflection mirror 10, a fly-eye lens 11, an aperture stop 12, a condenser lens 13, a reduction projection lens system 15, and a wafer stage 20.

The light source unit 19 generates exposing light such as the i-line and emits a beam of the exposing light to the reflection mirror 10. The mirror 10 reflects the beam and changes its direction toward the fly-eye lens 11.

The fly-eye lens 11 receives the beam of the light to minimize its illumination variation or fluctuation, making its intensity uniform over the entire beam at the outlet of the lens 11. The lens 11 is made of a plurality of lens elements 11a arranged in a matrix array within the same horizontal plane.

The aperture stop 12 has a filter 12a for narrowing the beam of the exposing light penetrating through the fly-eye lens 11 and for adjusting the intensity distribution within the cross-section of the beam. The stop 12 with the filter 12a can be turned around a vertically fixed shaft 12b so that it is on or out of the optical path of the beam for replacement.

The condenser lens 13 receives the narrowed and intensity-adjusted beam on a reticle 14 placed between the lens 13 and the projection lens system 15 during an exposure process. The reduction projection lens system 15 projects an image of the patterns of geometrical shapes formed on the reticle 14 to a semiconductor wafer 21 placed on the wafer stage 20 with a specified demagnification ratio such as 2 to 10. These patterns define the various regions in an integrated circuit (IC) such as the implantation regions and the contact windows.

The wafer 21, which is placed on the wafer stage 20, has a plurality of image fields arranged in a matrix array. Each of the image fields is exposed to the beam exposing light at a time. The shape and size of each image field are, for example, square and approximately 20 mm×20 mm, respectively.

The image fields of the wafer 21 are stepped over its surface by two-dimensional translations of the wafer 21, which is generated by movement of the wafer stage 20. Thus, all the image fields are successively exposed to the beam of the exposing light, thereby transferring the patterns of the reticle 14 onto all the image fields.

The above structure is the same as that of the conventional one of FIG. 1.

As shown in FIGS. 4 and 5, the projection exposure system according to the first embodiment has a measuring unit or mechanism 1 provided between the aperture stop 12 and the condenser lens 13. This unit 1 is used for measuring the intensity of a ray 8 of the exposure light penetrating through a particular one of the lens elements 11a of the fly-eye lens 11, thereby obtaining the intensity distribution of the beam of the light for the entire lens 11.

As shown in FIG. 5, the measuring unit 1 contains a rigid shroud or casing 3 located just under the outlet of the aperture stop 12. The shroud 3 has a penetrating hole 3a at its top plate on its one side. A reflection mirror 4 is located under the hole 3a in the shroud 3. The mirror 4 reflects the ray 8 of the exposing light entering vertically through the lens element 11a and the hole 3a and change its direction horizontally.

The reflected ray 8 enters a lens 23a placed at the approximately center of the shroud 3 and a lens 23b placed at its opposite side to the mirror 4 within the shroud 3. The ray 8 penetrating the pair of the lens 23a and 23b is received or trapped by an illumination detector 2 placed at the opposite side of the shroud 3 to the mirror 4. The detector 2 photoelectrically converts the received ray 8 of the light to generate an electric signal.

The shroud 3 supports the reflection mirror 4 and the pair of the lenses 23a and 23b as well as the illumination detector 2, so that their optical axes are in accordance with each other.

The shroud 3 is horizontally movable in the perpendicularly crossing X- and Y-directions by controlling a translation mechanism. This mechanism is equipped with a bracket 6a placed under the shroud 3, a base 6b placed under the bracket 6a, bearings 7 placed between the bracket 6a and the base 6b, an X-direction pulse motor 5a fixed to the bracket 6a, and a Y-direction pulse motor 5b fixed to the base 6b. The bracket 6a holds the shroud 3 thereon to be movable in the X-direction. The base 6b supports the bracket 6a thereon through the bearings 7 to be movable in the Y-direction.

An X-direction pulse motor 5a is fixed to the bracket 6a. The motor 5a is connected to a feed screw 25a extending in the X-direction. The screw 25a is inserted into a nut 24a fixed to the shroud 3 to be engaged therewith. The screw 25a rotates in steps according to the number of applied current/voltage pulses, so that the shroud 3 is translated in steps in the X-direction.

A Y-direction pulse motor 5b is fixed to the base 6b. The motor 5b is connected to a feed screw 25b extending in the Y-direction. The screw 25b is inserted into a nut 24b fixed to the base 6b to be engaged therewith. The screw 25b rotates in steps according to the number of applied current/voltage pulses, so that the bracket 6a and the shroud 3 are translated in steps in the Y-direction.

Therefore, if the pulse motors 5a and 5b are adaptibly controlled, in other words, if the proper numbers of the current/voltage pulses are applied to the motors 5a and 5b, respectively, the hole 3a of the shroud 3 can be positioned just below any particular one of the lens elements 11a of the fly-eye lens 11 to allow the ray 8 of the light to enter the shroud 3.

The ray 8 of the exposing light entered the shroud 3 is reflected by the mirror 4 and is transmitted through the pair of the lenses 23a and 23b to the illumination detector 2, producing an analog current signal. The analog signal is converted into a digital signal by the detector 2. The digital signal is then data-processed together with the positional signal from the pulse motors 5a and 5b, displaying the illumination value of the present ray 8 of the light on a screen.

Repetition of the same detection process enables to indicate the light intensity distribution over the entire fly-eye lens 11 on the screen. In other words, the light intensity distribution within each image field of the wafer 21 is displayed on the screen.

Figure 6:
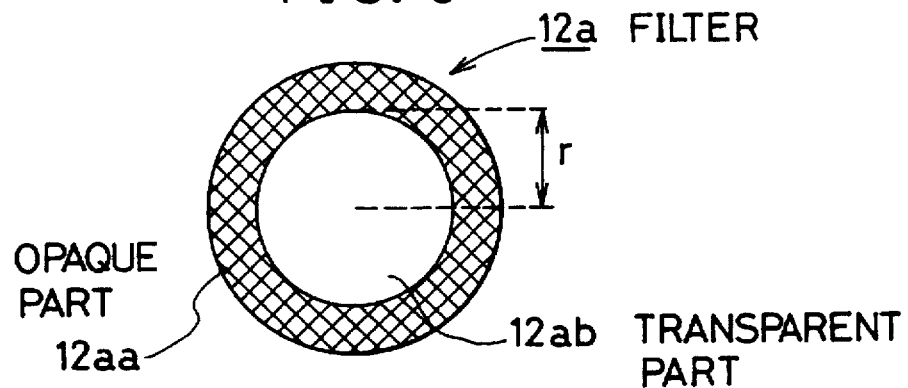
FIG. 6 is a schematic plan view of a filter of the aperture stop used for the reduction step-and-repeat projection exposure system according to the first embodiment.

FIG. 6 shows an example of the filter 12a of the aperture stop 12, which is made of an annular opaque part 12aa with a transmittance of 0% and a circular transparent part 12ab with a transmittance of 100%. The transparent part 12ab has a radius of r less than that of the beam of the exposing light before the aperture stop 12. Thus, the beam of the light is narrowed and shaped by the filter 12a, producing a narrowed, circular beam. In this case, the intensity distribution of the beam of the light is the Gaussian distribution as shown in FIG. 3A.

Figure 3B:
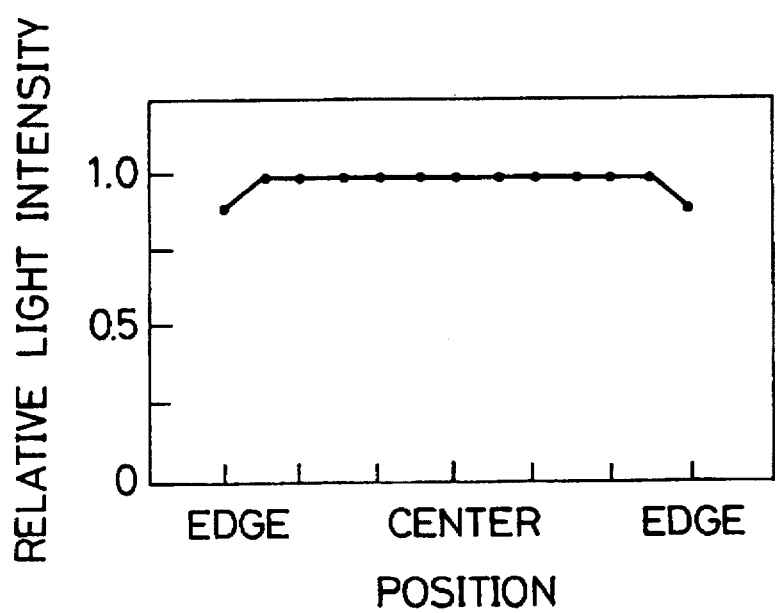
FIG. 3B is a graph showing the light intensity distribution of a beam of an exposing light for an entire fly-eye lens at its outlet, which is approximately flat.
Figure 7:
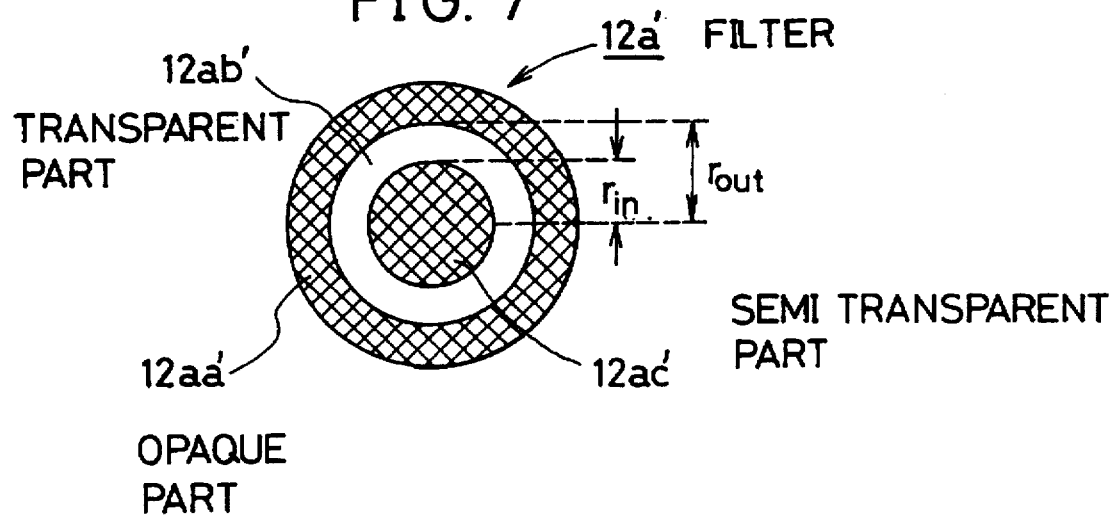
FIG. 7 is a schematic plan view of another filter of the aperture stop used for the reduction step-and-repeat projection exposure system according to the first embodiment.

FIG. 7 shows another filter 12a' of the aperture stop 12, which is made of an annular opaque part 12aa' with a transmittance of 0%, an annular transparent part 12ab' with a transmittance of 100%, and a circular semi-transparent part 12ac' with a transmittance of 25%. The transparent part 12ab' has an outer radius of $r_{out}$ less than that of the beam of the exposing light before the aperture stop 12, and an inner radius of $r_{in}$. Thus, the beam of the light is narrowed and shaped by the filter 12a', producing a narrowed, circular beam. The peripheral area of the beam is higher in transmittance that the central area thereof corresponding to the transmittance difference. In this case, the intensity distribution of the beam of the light can be approximately flat as shown in FIG. 3B.

Figure 8:
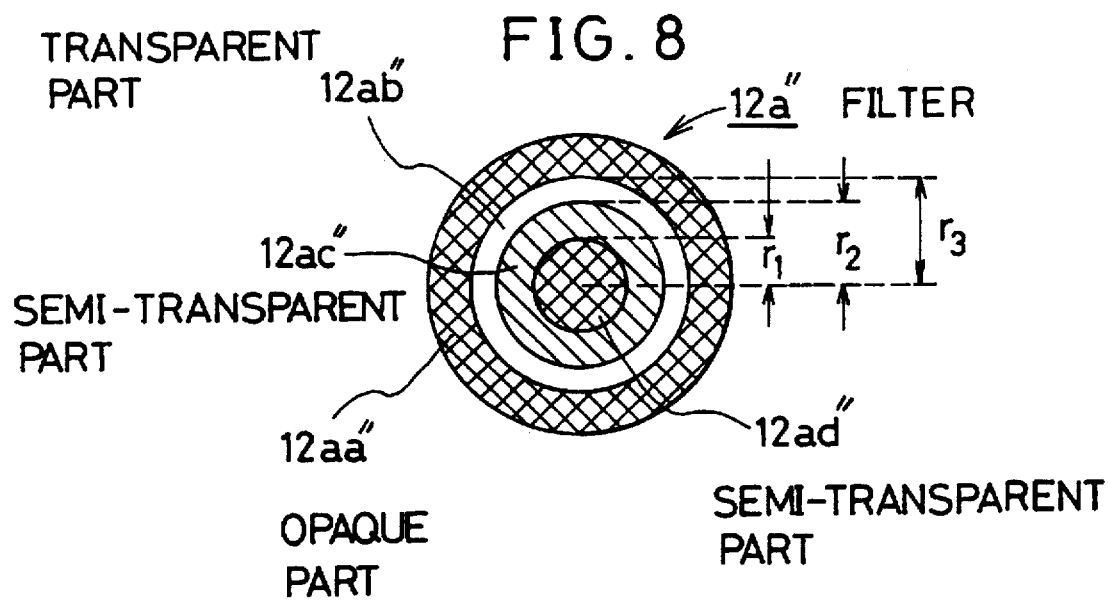
FIG. 8 is a schematic plan view of a further filter of the aperture stop used for the reduction step-and-repeat projection exposure system according to the first embodiment.

FIG. 8 shows a further filter 12a" of the aperture stop 12, which is made of an annular opaque part 12aa" with a transmittance of 0%, an annular transparent part 12ab" with a transmittance of 100%, an annular semi-transparent part 12ac" with a transmittance of 30%, and a circular semi-transparent part 12ad" with a transmittance of 50%.

The transparent part 12ab" has an outer radius of $r_3$ less than that of the beam of the exposing light before this aperture stop 12a" and an inner radius $r_2$. The semi-transparent part 12ac" has an outer radius of $r_2$ and an inner radius of $r_1$. The semi-transparent part 12ad" has an outer radius of $r_1$. Thus, the beam of the light is narrowed and shaped by the filter 12a". The peripheral area of the beam is higher in transmittance than the middle area thereof, and the middle area of the beam is higher in transmittance than the central area thereof, producing a narrowed, circular beam corresponding to the transmittance difference. In this case, the intensity distribution of the beam of the light can be approximately flat as shown in FIG. 3B.

Figure 9:
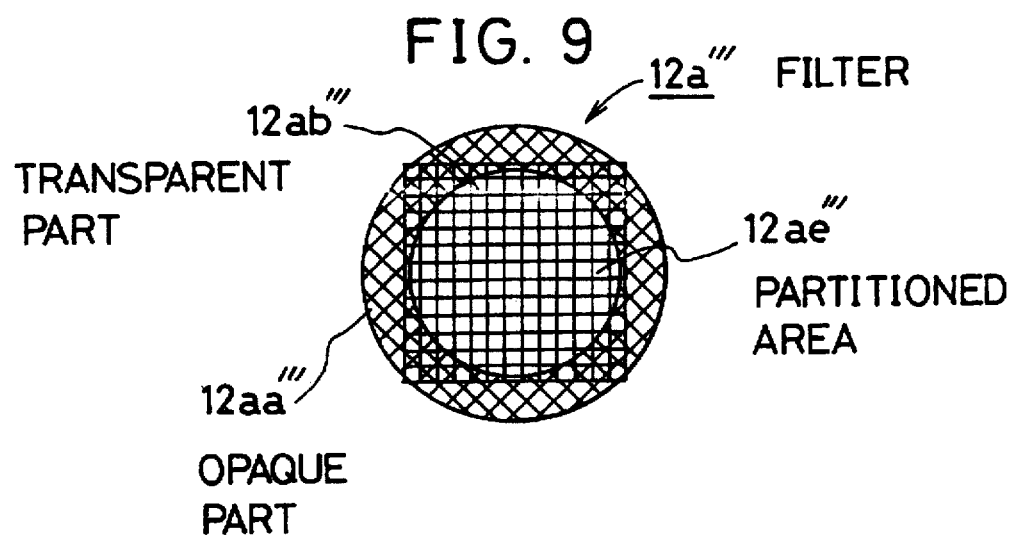
FIG. 9 is a schematic plan view of still another filter of the aperture stop used for the reduction step-and-repeat projection exposure system according to the first embodiment.

When the fly-eye lens 11 is, for example, composed of lengthwise 13×crosswise 13 square lens elements 11a, and the light intensity for each particular square element 11a is to be corrected, the aperture stop 12 may be reticulated as shown in FIG. 9 to make the transmittance for the elements 11a different. Specifically, the filter 12a''' is made of an annular opaque part 12aa''' with a transmittance of 0% and a circular transparent part 12ab''' with a transmittance of 100%. The transparent part 12ab''' has a radius of r less than that of the beam of the exposing light before the aperture stop 12. Thus, the beam of the light is narrowed and shaped by the filter 12a''', producing a narrowed, circular beam. The reference numeral 12ae''' indicates each partitioned area of the filter 12a'''. Also in this case, the intensity distribution of the beam of the light can be approximately flat as shown in FIG. 3B.

Next, an exposure method using the exposure system according to the first embodiment is described below referring to FIG. 10.

In a step S1, as shown in FIGS. 4 and 5, the light intensity distribution measuring unit 1 is inserted to be set on the optical path of the beam of the exposing light at a specified position between the aperture stop 12 and the condenser lens 13. This setting is performed by driving the X- and Y-direction pulse motors 5a and 5b.

In a step S2, the measuring unit 1 is operated using the preset aperture stop 12 and the filter 12a to measure the intensity distribution for the beam of the exposing light. The intensity distribution thus obtained is, for example, shown on a display screen to indicate the state of the distribution to an operator.

In a step S3, whether the distribution thus obtained is in accordance with a wanted distribution or not is judged. If the answer is "yes", the measuring unit 1 is removed from the optical path of the beam, as shown in a step S5. This removal is performed by driving the X- and Y-direction pulse motors 5a 5b. Then, an optical exposure process is performed in the same manner as that of the conventional exposure system of FIG. 1 in a step S6.

If the answer in "no", the aperture stop 12 with the filter 12a is turned around the shaft 12b in a horizontal plane to replace the present aperture stop 12 and/or filter 12a with another one as shown in a step S4. Subsequently, returning to the step S2, the same measurement process as above is repeated again in the step S3.

Such the procedure is repeated until the desired light intensity distribution is obtained, thereby correcting the distribution to be in accordance with the wanted distribution. Subsequently, after the measuring unit 1 is removed from the optical path of the beam (step S5), the optical process is performed (step S6).

During this exposure process in the step S6, the beam of the exposing light having the wanted intensity distribution is projected onto the wafer 21.

With the exposure system according to the first embodiment, the illumination detector 2 detects the illumination of the ray 8 of the exposing light penetrating through one of the lens elements 11a of the fly-eye lens 11, and the translation mechanism aligns the position of the detector 2 with the corresponding one of the lens elements 11a to receive the ray penetrating therethrough. Therefore, by aligning sequentially the position of the detector 2 with the respective lens elements 11a of the fly-eye lens 11, the intensity distribution of the beam of the light can be known for the entire fly-eye lens. 11

As a result, even if the time-dependent illumination deterioration of the light source of the exposing light and/or replacement of the source occur, satisfactory DOF and resolution can be maintained. Accordingly, uniform pattern transfer with high accuracy can be realized independent of the time-dependent illumination deterioration of the light source and/or replacement of the source.

This uniform pattern transfer with high accuracy can be realized even for fine patterns of the geometrical shapes on the reticle 14, because the intensity distribution of the beam of the light can be known for the entire fly-eye lens 11.

Further, since the shape and the intensity distribution of the beam can be adjusted with the aperture stop 12 based on the known intensity distribution of the beam, an exposure process can be made at a fixed light intensity distribution.

Second Embodiment

Figure 11:
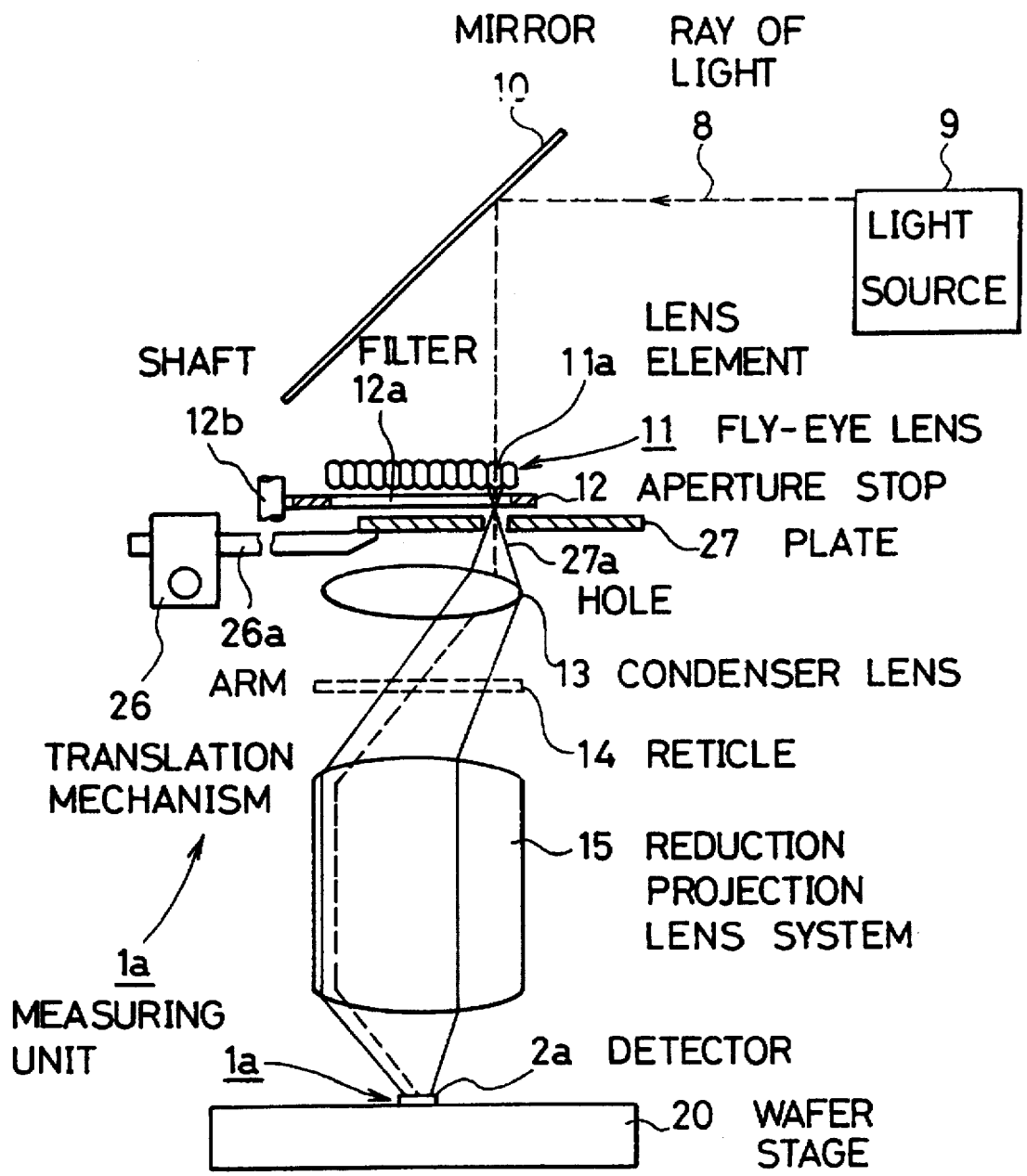
FIG. 11 is a schematic view of a reduction step-and-repeat projection exposure system according to a second embodiment of the present invention.

FIG. 11 shows a reduction step-and-repeat projection exposure system according to a second embodiment of the present invention. As shown in FIG. 11, the exposure system according to the second embodiment is the same in structure as that of the first embodiment of FIGS. 4 and 5 other than that an illumination detector 2a is placed on the wafer stage 20 and that a plate 27 with a penetrating hole 27a is provided between the aperture stop 12 and the condenser lens 13 instead of the shroud 3.

Therefore, for the sake of simplification of description, the explanation relating to the corresponding elements in the both embodiments is omitted here by attaching the same reference numerals to the corresponding elements.

The hole 27a of the plate 27 allows the ray 8 of the exposing light to pass through the plate 27 toward the illumination detector 2a on the wafer stage 20.

The plate 27 is mechanically connected to a translation mechanism 26 through an arm 26a. The mechanism 26 has substantially the same structure as that of the combination of the X- and Y-pulse motors 5a and 5b, the feed screws 15a and 25b, and the nuts 24b and 25b. The plate 27 is horizontally translated in the X- and Y-directions by the mechanism 26.

The plate 27, the translation mechanism 26 and the illumination detector 2a constitute a measuring unit 1a. This unit 1a is used for measuring the intensity of the ray 8 of the exposure light penetrating through a particular one of the lens elements 11a of the fly-eye lens 11, thereby obtaining the intensity distribution of the beam of the light for the entire lens 11.

With the exposure system according to the second embodiment, the ray 8 penetrating through the hole 27a of the plate 27 is transmitted to the detector 2a placed on the wafer stage 20 through the condenser lens 13 and the reduction projection lens system 15. The reticle 14 needs to be removed out of the optical path of the beam of the light, because the ray 8 is affected by the reticle 14, which is different from the first embodiment. The position of the detector 2a is preferably set on the central axis of the optical path of the beam.

Repetition of the same detector process enables to indicate the light intensity distribution over the entire fly-eye lens 11 on the screen. In other words, the light intensity distribution within each image field of the wafer 21 is displayed on the screen.

The light intensity distribution for the beam of the exposing light can be measured after the beam is transmitted through all optical components of the exposure system, in other words, the light intensity distribution on the actual wafer 20 can be measured rather than that just after the fly-eye lens 11 in the above first embodiment. Accordingly, an advantage that the light intensity distribution on the actual wafer 21 can be measured more exactly than the case of the first embodiment.

Figure 10:
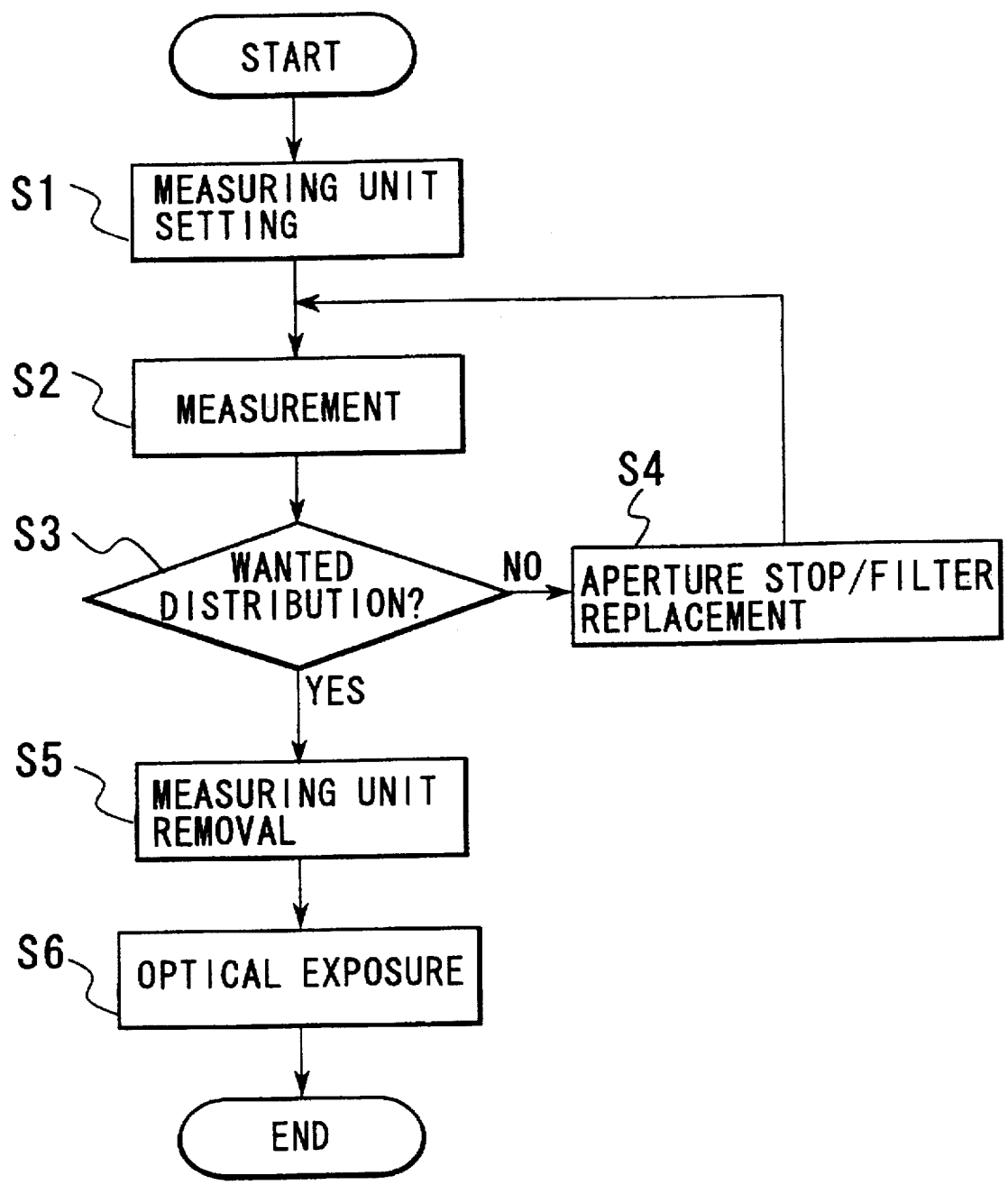
FIG. 10 is a flow chart showing an exposure process using the reduction step-and-repeat projection exposure system according to the first embodiment.

The exposure method using the system according to the second embodiment is the same as that of the first embodiment as shown in FIG. 10.

Therefore, the same advantage as that of the first embodiment can be obtained.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An exposure system, comprising:

a light source for emitting a beam of exposing light;

a fly-eye lens for minimizing illumination variety of said beam within a cross section of said beam, said fly-eye lens having lens elements arranged in a plane;

an aperture stop for narrowing said beam penetrating through said fly-eye lens and for adjusting an intensity distribution of said beam;

a wafer stage for supporting a wafer thereon;

an illumination detector for detecting an illumination of a ray of said beam of exposing light penetrating through one of said lens elements of said fly-eye lens;

an aligner for aligning a position of said detector with said corresponding one of said lens elements; and a ray-selecting member for selecting one of a plurality of rays of said exposing light penetrating through said lens elements of said fly-eye lens, said member having a penetrating hole and being placed between said aperture stop and said wafer stage, said aligner for moving said ray selecting member along said plane of said fly-eye lens to allow said one of said rays of said exposing light to selectively pass through said hole.

2. The exposure system as claimed in claim 1, wherein said illumination detector is placed between said aperture stop and said wafer stage, and wherein said detector detects said illumination of said ray penetrating through one of said lens elements of said fly-eye lens and said aperture stop.

3. The exposure system as claimed in claim 1, wherein said illumination detector is placed on said wafer stage, and wherein said detector detects illumination of said selected ray penetrating through said one of said lens elements of said fly-eye lens.

4. The exposure system as claimed in claim 1, further comprising a casing comprising said ray-selecting member, said casing being placed between said aperture stop and said wafer stage, wherein said detector is placed in said casing, and said selected ray of said exposing light enters said casing through said hole to be detected by said detector, and wherein said aligner moves said casing along said plane of said fly-eye lens to be selectively located at positions corresponding to ones of said lens elements of said fly-eye lens.

5. The exposure system as claimed in claim 4, wherein said aligner has first and second pulse motors for translating said casing along said plane of said fly-eye lens, and wherein said first motor translates said casing in a first horizontal direction and said second motor translates said casing in a second horizontal direction perpendicular to said first direction.

6. The exposure system as claimed in claim 1, further comprising a screen serving as said ray-selecting member, said screen having said penetrating hole and placed between said aperture stop and said wafer stage, wherein said detector is placed on said wafer stage, and said ray of said exposing light penetrates through said hole to be detected by said detector.

7. The exposure system as claimed in claim 6, wherein said aligner has first and second pulse motors for translating said screen along said plane of said fly-eye lens, and wherein said first motor translates said screen in a first horizontal direction and said second motor translates said screen in a second horizontal direction perpendicular to said first direction.

8. An exposure method, comprising the steps of:

preparing a fly-eye lens for minimizing illumination variety of a beam of exposing light within a cross section of said beam, said fly-eye lens having lens elements arranged in a plane;

preparing an aperture stop for narrowing said beam penetrating through said fly-eye lens and for adjusting an intensity distribution thereof;

preparing a wafer stage for placing a wafer thereon;

preparing a ray-selecting member for selecting one of a plurality of rays of said exposing light penetrating through said lens elements of said fly-eye lens, said member having a penetrating hole and being placed between said aperture stop and said wafer stage;

selecting one of said rays of said exposing light penetrating through said lens elements by aligning said hole with a desired one of said lens elements, thereby allowing a selected one of said rays of said exposing light to selectively pass through said hole;

measuring an illumination of said selected one of said rays of said exposing light;

comparing a measured value of said illumination with a desired value for said illumination;

correcting for said measured value of said illumination by adjusting said aperture stop; and performing an exposure process using a corrected value of said illumination.

9. The exposure method as claimed in claim 8, further comprising the step of placing an illumination detector between said aperture stop and said wafer stage.

10. The exposure method as claimed in claim 8, further comprising the step of placing an illumination detector on said wafer stage.

11. The exposure method as claimed in claim 8, further comprising the steps of:

placing an illumination detector in a casing comprising said ray-selected member, said casing being placed between said aperture stop and said wafer table;

introducing said ray of said exposing light into said casing through said hole to be detected by an illumination detector; and moving said said casing along said plane of said fly-eye lens to be located at positions corresponding to said lens elements of said fly-eye lens.

12. The exposure method as claimed in claim 11, further comprising the step of translating said casing in a first horizontal direction by a first motor and in a second horizontal direction perpendicular to said first direction by a second motor.

13. The exposure method as claimed in claim 8, further comprising the step of:

providing a screen serving as said ray-selecting member, wherein an illumination detector is placed on said wafer stage and moving said screen along said plane of said fly-eye lens to be located at positions corresponding to said lens elements of said fly-eye lens.

14. The exposure method as claimed in claim 13, further comprising the step of translating said screen along said plane of said fly-eye lens by first and second pulse motors;

and wherein said screen is translated by said first motor in a first horizontal direction said by second motor in a second horizontal direction perpendicular to said first direction.

* * * * *